US009245951B1

(12) United States Patent
Camillo-Castillo et al.

(10) Patent No.: US 9,245,951 B1
(45) Date of Patent: Jan. 26, 2016

(54) PROFILE CONTROL OVER A COLLECTOR OF A BIPOLAR JUNCTION TRANSISTOR

(71) Applicant: GLOBALFOUNDRIES INC., Grand Cayman (KY)

(72) Inventors: Renata Camillo-Castillo, Essex Junction, VT (US); David L. Harame, Essex Junction, VT (US); Vibhor Jain, Essex Junction, VT (US); Vikas K. Kaushal, Essex Junction, VT (US); Marwan H. Khater, Astoria, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/487,582

(22) Filed: Sep. 16, 2014

(51) Int. Cl.
| H01L 21/331 | (2006.01) |
| H01L 29/08 | (2006.01) |
| H01L 29/732 | (2006.01) |
| H01L 29/66 | (2006.01) |
| H01L 29/10 | (2006.01) |

(52) U.S. Cl.
CPC ........ *H01L 29/0826* (2013.01); *H01L 29/0804* (2013.01); *H01L 29/1004* (2013.01); *H01L 29/66234* (2013.01); *H01L 29/7325* (2013.01); *H01L 29/66242* (2013.01)

(58) Field of Classification Search
CPC ..................... H01L 29/0826; H01L 29/66234; H01L 29/66242
USPC ............................ 438/309, 312; 257/E29.174
See application file for complete search history.

(56) References Cited

U.S. PATENT DOCUMENTS

| 5,096,844 | A | 3/1992 | Konig et al. | |
| 5,117,271 | A | 5/1992 | Comfort et al. | |
| 5,336,909 | A | 8/1994 | Katoh et al. | |
| 5,402,002 | A * | 3/1995 | Meister et al. | 257/586 |
| 6,482,710 | B2 | 11/2002 | Oda et al. | |
| 6,521,974 | B1 | 2/2003 | Oda et al. | |
| 6,589,849 | B1 | 7/2003 | Lee | |
| 6,927,476 | B2 | 8/2005 | Freeman et al. | |
| 7,071,500 | B2 | 7/2006 | Miura et al. | |
| 7,075,126 | B2 | 7/2006 | Greenberg et al. | |
| 7,190,046 | B2 | 3/2007 | Akatsu et al. | |
| 7,425,754 | B2 | 9/2008 | Akatsu et al. | |
| 7,462,923 | B1 | 12/2008 | U'Ren | |
| 7,494,887 | B1 * | 2/2009 | Hussain | 438/309 |
| 7,615,457 | B2 | 11/2009 | Akatsu et al. | |
| 7,880,270 | B2 | 2/2011 | Heinemann et al. | |
| 8,610,174 | B2 | 12/2013 | Adkisson et al. | |
| 2009/0179303 | A1* | 7/2009 | Heinemann et al. | 257/586 |
| 2011/0156143 | A1* | 6/2011 | Chiu et al. | 257/336 |
| 2012/0001192 | A1* | 1/2012 | Fox et al. | 257/75 |

* cited by examiner

*Primary Examiner* — Kimberly Rizkallah
*Assistant Examiner* — Maria Ligai
(74) *Attorney, Agent, or Firm* — Thompson Hine LLP; Anthony J. Canale (57) ABSTRACT

Device structures and fabrication methods for a bipolar junction transistor. A layer is formed on a top surface of a substrate. A trench is formed in the layer and has a plurality of sidewalls with a width between an opposite pair of the sidewalls that varies with increasing distance from the top surface of the substrate. A collector pedestal of the bipolar junction transistor is formed in the trench.

20 Claims, 11 Drawing Sheets

PROFILE CONTROL OVER A COLLECTOR OF A BIPOLAR JUNCTION TRANSISTOR

BACKGROUND

The invention relates generally to integrated circuit fabrication and semiconductor devices and, in particular, to fabrication methods and device structures for a bipolar junction transistor.

Bipolar junction transistors are found, among other end uses, in high-frequency and high-power end use applications. In particular, bipolar junction transistors may be used in microwave power amplifiers used in wireless communications systems and power amplifiers in mobile devices, as well as high-speed logic circuits.

Bipolar junction transistors are three-terminal electronic devices that include semiconductor regions defining an emitter, an intrinsic base, and a collector. An NPN bipolar junction transistor includes two regions of n-type semiconductor material constituting the emitter and collector, and a region of p-type semiconductor material constituting the intrinsic base situated between the two regions of n-type semiconductor material. A PNP bipolar junction transistor includes two regions of p-type semiconductor material constituting the emitter and collector, and a region of n-type semiconductor material constituting the intrinsic base situated between the two regions of p-type semiconductor material. The emitter, intrinsic base, and collector define a pair of p-n junctions, namely a collector-base junction and an emitter-base junction, across which the conductivity type of the respective semiconductor materials changes. A voltage applied across the emitter-base junction controls the movement of charge carriers that produces charge flow between the collector and emitter.

Improved fabrication methods and device structures are needed for a bipolar junction transistor.

SUMMARY

In an embodiment of the invention, a method is provided for fabricating a bipolar junction transistor. The method includes forming a layer on a top surface of a substrate, forming a trench in the layer that has a plurality of sidewalls with a width between an opposite pair of the sidewalls that varies with increasing distance from the top surface of the substrate, and forming a collector pedestal of the bipolar junction transistor in the trench.

In an embodiment of the invention, a device structure is provided for a bipolar junction transistor. The device structure includes a collector pedestal on a top surface of a substrate and an intrinsic base on the collector pedestal. The collector pedestal includes a section with a plurality of sidewalls. An opposite pair of the sidewalls is separated by a width between that varies with increasing distance from the top surface of the substrate.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
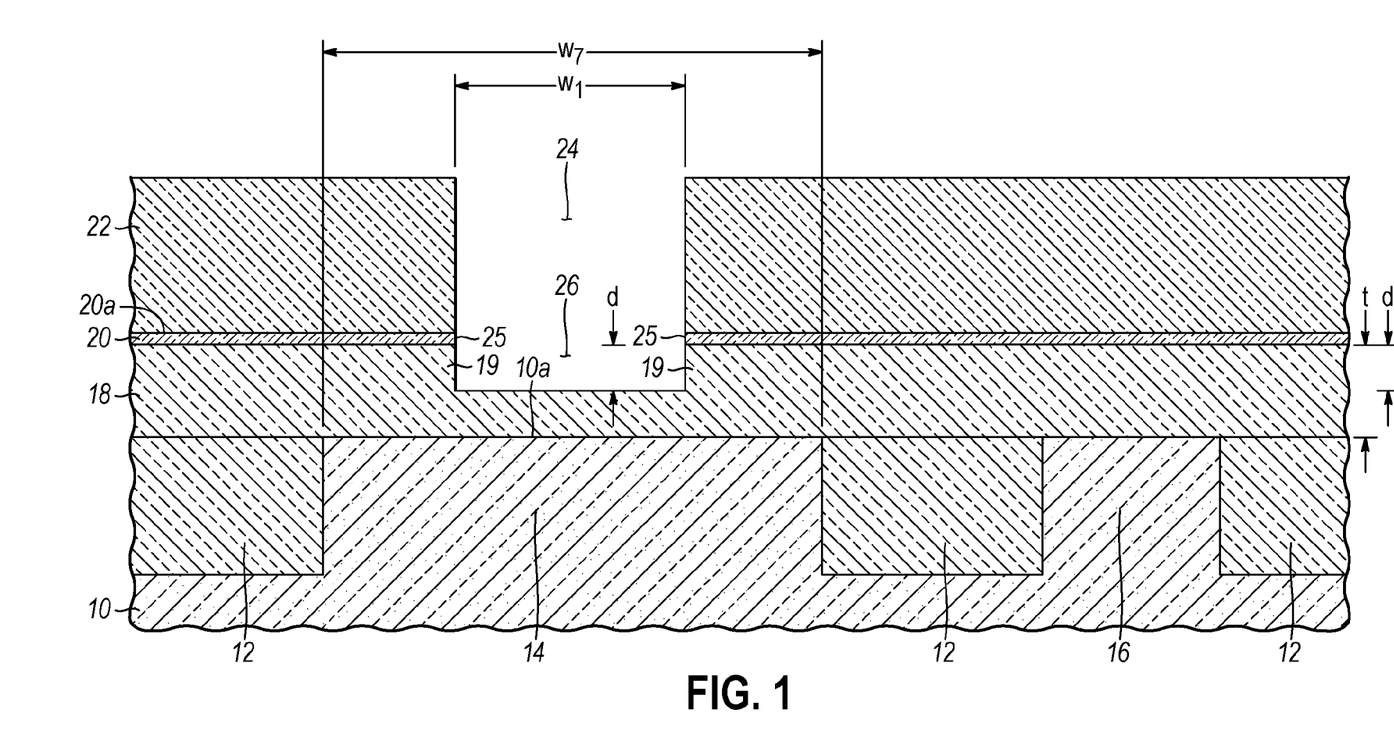
FIGS. 1-8 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single-crystal semiconductor material usable to form the devices of an integrated circuit. The semiconductor material constituting the substrate 10 may include an epitaxial layer at its surface, which may be doped with an electrically-active dopant to alter its electrical properties. For example, the substrate 10 may include an epitaxial layer of single crystal silicon that is epitaxially deposited or grown by chemical vapor deposition (CVD) and that is doped with a concentration of an n-type dopant from Group V of the Periodic Table (e.g., phosphorus (P) or arsenic (As)) in a concentration that is effective to impart n-type conductivity.

Trench isolation regions 12 are formed in the substrate 10. The trench isolation regions 12 define, and furnish electrical isolation for, a device region 14 and a collector contact region 16 each comprised of the semiconductor material of the substrate 10. The collector contact region 16 is positioned adjacent to the device region 14 and is separated from the device region 14 by one of the trench isolation regions 12. The locations and arrangement of the trench isolation regions 12 define the size, geometrical shape, and outer perimeter of the device region 14 and collector contact region 16. The trench isolation regions 12 may be formed by a shallow trench isolation (STI) technique that involves defining trenches with lithography and dry etching processes, depositing an electrical insulator to fill the trenches, and planarizing the electrical insulator relative to the top surface 10*a* of substrate 10 using, for example, chemical mechanical polishing (CMP). The trench isolation regions 12 may be comprised of a dielectric material, such as an oxide of silicon (e.g., silicon dioxide ($SiO_2$)) deposited by CVD.

Dielectric layers 18, 20 are sequentially deposited and a patterned etch mask 22 is applied. The dielectric layers 18, 20 may each be comprised of an electrical insulator with a dielectric constant (e.g., permittivity) characteristic of a dielectric material. In one embodiment, the dielectric layer 18 may be comprised of $SiO_2$ deposited by CVD, and the dielectric layer 20 may be comprised of silicon nitride ($Si_3N_4$) deposited using CVD. The dielectric layer 20 is a sacrificial layer that is absent from the completed device structure. In contrast, a portion of dielectric layer 18 is present in the completed device structure, and operates to increase the spacing of the device region 14 away from the extrinsic base in the completed device structure.

The etch mask 22 may be comprised of a layer of a light-sensitive material, such as an organic photoresist, that may be applied by a spin coating process, pre-baked, exposed to light projected through a photomask, baked after exposure, and developed with a chemical developer. The etch mask 22 includes an opening 24 that is located at an intended location relative to the device region 14 for a subsequently-formed collector pedestal of a bipolar junction transistor.

The opening 24 in the etch mask 22 is extended through the dielectric layer 20 with an etching process that removes the dielectric material comprising dielectric layer 20 at a greater rate than the dielectric material comprising dielectric layer 18. The opening 24 in the dielectric layer 20 includes edges 25 of which opposite edges 25 are separated by a distance given by a width, $w_1$. The device region 14 has a width, $w_7$, measured between opposite trench isolation regions 12 that is greater than the width, $w_1$, of the opening 24. The length dimension of the device region 14 between the trench isolation regions 12 may also be greater than the length dimension of the opening 24.

A trench 26 is formed in the dielectric layer 18 using another etching process. The trench 26 includes sidewalls 29 that are aligned and coplanar with the edges 25 of the opening 24 in the dielectric layer 20. Opposite pairs of the sidewalls 29 of the trench 26 and opposite edges 25 of the opening 24 in the dielectric layer 20 may be contained in vertical and parallel planes, and may be separated by a distance given by the width, $w_1$. The dielectric layer 18 is etched by the etching process using an etch chemistry selected to remove its dielectric material at a higher rate than the dielectric material of dielectric layer 20. The etching processing may comprise a wet chemical etching process or a dry etching process, such as reactive-ion etching (RIE).

The trench 26 penetrates partially through the thickness of dielectric layer 18. The trench 26 does not penetrate completely through dielectric layer 18 to reach the top surface 10a of the substrate 10. Specifically, the trench 26 penetrates to a depth, d, through the dielectric layer 18 that is less than a total thickness, t, of the dielectric layer 18. In one embodiment, the etching process may be timed to achieve a targeted depth for the partial penetration of the trench 26 through the dielectric layer 18.

Figure 2:
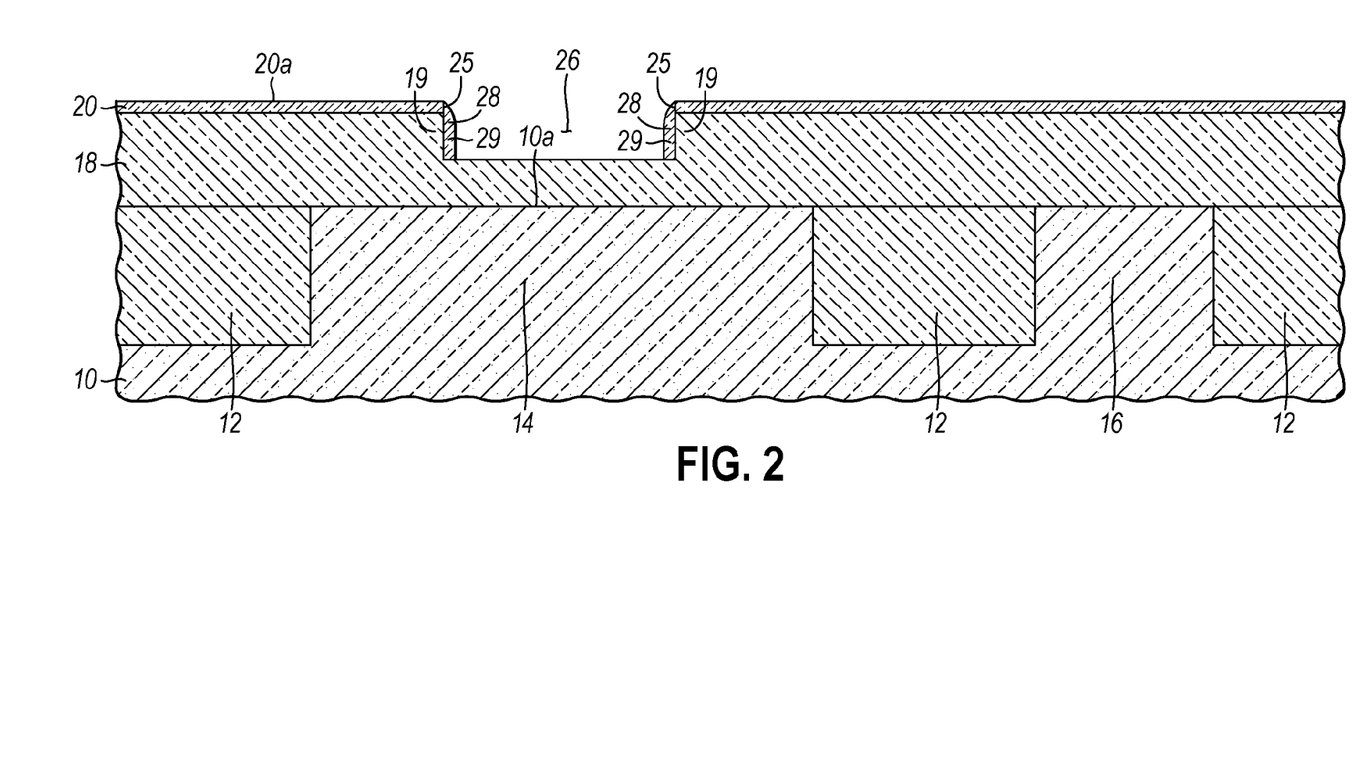

With reference to FIG. 2 in which like reference numerals refer to like features in FIG. 1 and at a subsequent fabrication stage of the processing method, the etch mask 22 may be removed subsequent to the formation of the trench 26. If comprised of a photoresist, the etch mask 22 may be removed by ashing or solvent stripping, followed by a cleaning process.

Spacers 28 are formed on the sidewalls 29 of the dielectric layer 18 bordering the trench 26. An anisotropic etching process may be used to shape spacers 28 from a conformally-deposited dielectric layer. The spacers 28 may be comprised of an electrical insulator, such as silicon nitride ($Si_3N_4$) deposited using CVD. The spacers 28 are sacrificial elements that are subsequently removed in the processing flow and, as a result, are absent in the completed device structure.

Figure 3:
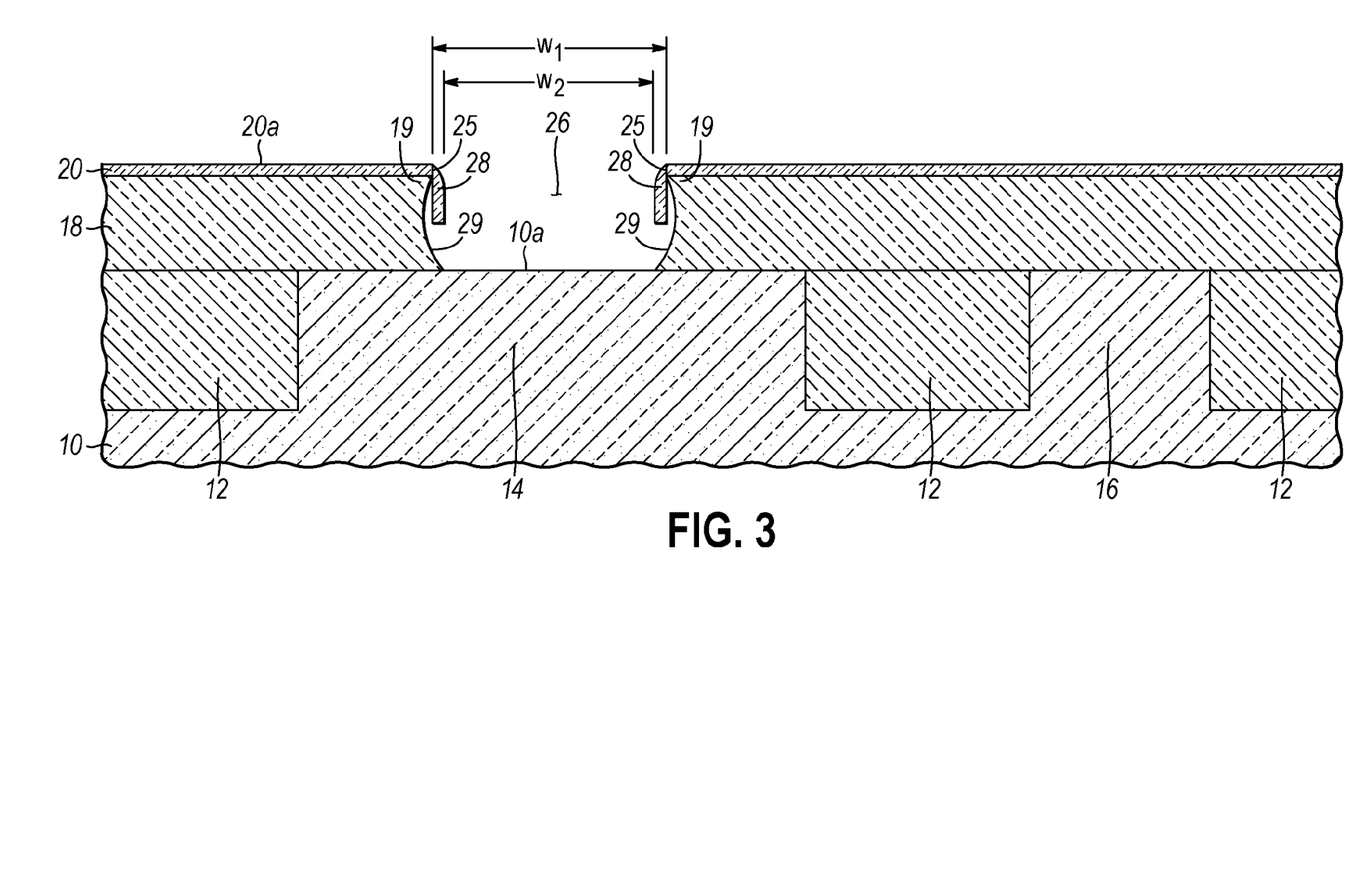

With reference to FIG. 3 in which like reference numerals refer to like features in FIG. 2 and at a subsequent fabrication stage of the processing method, an etching process, such as a wet chemical etching process, may be applied to at least partially remove the electrical insulator comprising the dielectric layer 18 adjacent to the sidewalls 29 of the dielectric layer 18 in order to enlarge the trench 26. If the dielectric layer 18 is comprised of an oxide of silicon, the wet chemical etching process may utilize an etchant comprising buffered hydrofluoric acid (BHF) or diluted hydrofluoric acid (DHF) that removes the oxide of silicon with a higher etch rate than (i.e., selectively relative to) the semiconductor material of the substrate 10 and the dielectric materials of the dielectric layer 20 and the spacers 28.

The sidewalls 29 of the dielectric layer 18 are recessed laterally from their initial planar arrangement and the dielectric layer 18 is undercut proximate to the spacers 28. The width of the trench 26 between an opposite pair of the sidewalls 29 varies with increasing distance from a plane including the top surface 10a of the substrate 10 (i.e., the top surface of the device region 14). The width, $w_2$, between the sidewalls 29 at the base of the trench 26 may be less than the width, $w_1$, between the sidewalls 29 at the entrance to the trench 26, and also less than the width, $w_7$, of the device region 14. The length dimensions between the sidewalls 29 at the base of the trench 26 and at the entrance to the trench 26 may have the same relationship such that the area of the trench 26 near the entrance to the trench 26 is greater than the area of the trench 26 near the base of the trench 26 proximate to the top surface 10a of the substrate 10.

The trench 26 acquires a bowl shape in which the sidewalls 29 may exhibit a concave curvature relative to a centerline of the trench 26. The trench 26 has a bottom portion over which the width separating opposite sidewalls 29 tapers over at least a portion of the height of each sidewall 29 in a direction normal to the top surface 10a of the substrate 10. Over this tapered portion of the height, the lateral dimensions (length and width) of the trench 26 increase with increasing distance from a plane containing the top surface 10a as the separation between opposite sidewalls 29 increases relative to the width, $w_2$. The trench 26 has a top portion that adjoins the bottom portion at an inflection point at which the tapering changes from outward to inward so that the separation between opposite sidewalls 29 decreases in a direction toward the entrance to the trench 26.

Corner portions 19 of the dielectric layer 20 are located adjacent to the edges 25 of the opening 24 in the dielectric layer 20. During the etching process, the spacers 28 pin the location of the edges 25 of the opening 24 in the dielectric layer 20 at the separation given by the width, $w_1$. The dielectric material of the dielectric layer 18 is removed by etching from behind spacers 28. However, the spacers 28 also protect the corner portions 19 of the dielectric layer 18 so that the concave curvature may be imparted to sidewalls 29 without widening the entrance to the trench 26 and thereby increasing the local width, $w_1$, of the trench 26 proximate to the entrance to the opening 24.

Figure 4:
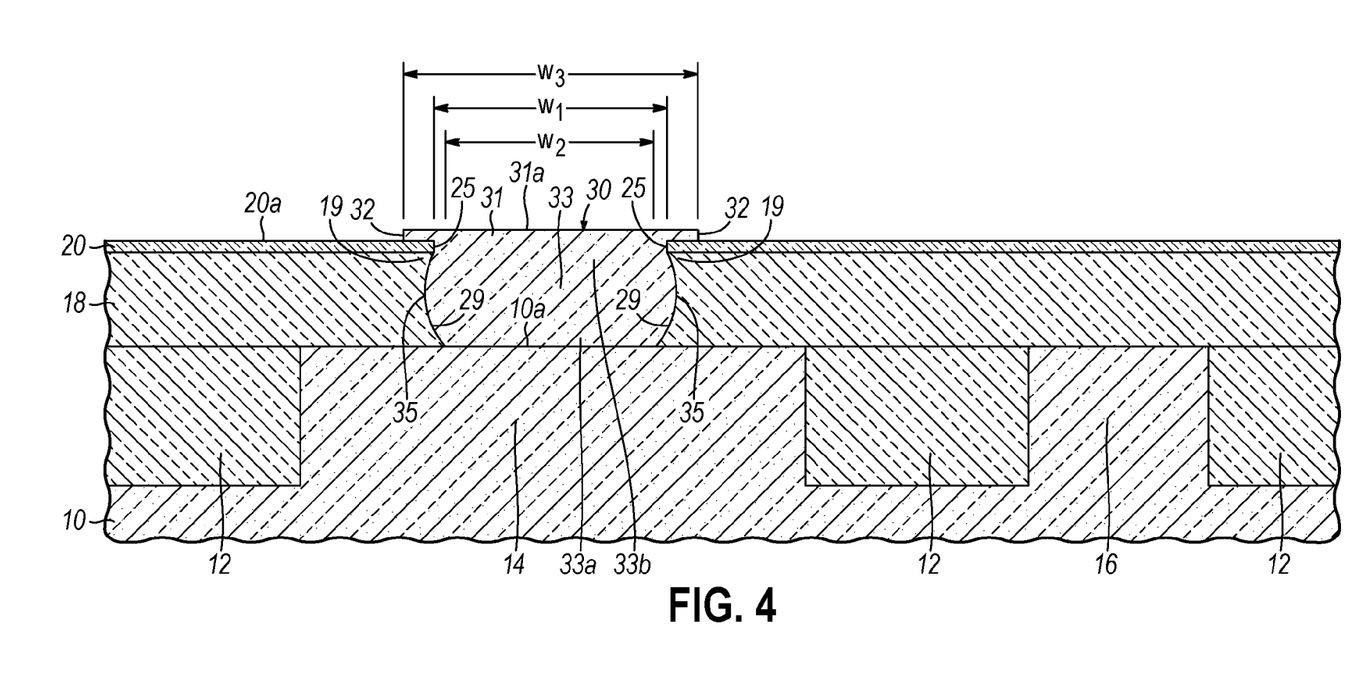

With reference to FIG. 4 in which like reference numerals refer to like features in FIG. 3 and at a subsequent fabrication stage of the processing method, an etching process, such as a wet chemical etching process, may be applied to remove the spacers 28 selective to the materials of the substrate 10 and the dielectric layer 20. Because of the protection afforded by the spacers 28 during etching, opposite corner portions 19 of the dielectric layer 18 at the entrance to the trench 26 are separated by the width, $w_1$, before and after the etching process is performed.

A collector pedestal 30 is formed in the trench 26 after the spacers 28 are removed. The collector pedestal 30 is comprised of a semiconductor material that has an epitaxial relationship with the semiconductor material of the substrate 10. The collector pedestal 30 may be comprised of silicon, which may be intrinsic or doped in situ during growth with a dopant, such as phosphorus to provide n-type conductivity. In an alternative embodiment, the collector pedestal 30 may be ion implanted with a dopant to elevate the conductivity. Alternatively, the collector pedestal 30 may be comprised of a semiconductor alloy with a controlled profile, such as intrinsic or in-situ doped silicon germanium, carbon-doped silicon, carbon-doped silicon germanium, or a combination thereof grown by selective epitaxy. The use of the collector pedestal 30 provides the ability to select its composition and to control its profile, which may be used to optimize device performance.

The collector pedestal 30 includes a section 31 of semiconductor material that is located outside of the trench 26 and that is wider than the opening 24 in the dielectric layer 20. The section 31 of the collector pedestal 30 extends laterally outward from the opening 24 in the dielectric layer 20 to overlap with a region of the dielectric layers 18, 20 adjacent to the entrance to the trench 26. This section 31 of the collector pedestal 30 results from overgrowth of the constituent semiconductor material across the dielectric layer 20 and terminates at an edge 32.

The collector pedestal 30 further includes a section 33 of semiconductor material that is located inside of the trench 26 and that has sidewalls 35 with a shape that matches the shape of the sidewalls 29 of the trench 26 to provide a controlled profile. The sidewalls 35, which are vertical when the trench 26 is initially formed, are transformed to a non-vertical arrangement. The width of the section 33 of the collector pedestal between an opposite pair of the sidewalls 35 varies with increasing distance from a plane containing the top surface 10a of the substrate 10 (i.e., the top surface of the device region 14). In the representative embodiment, the sidewalls 35 of the section 33 of the collector pedestal 30 have a convex curvature in the controlled profile that matches the concave curvature of the sidewalls 29 of the trench 26 so that the section 33 of the collector pedestal 30 has a bowl shape. The section 33 of the collector pedestal 30 has a bottom portion 33a over which the width separating opposite sidewalls 35 tapers over at least a portion of the height of each sidewall 35 in a direction normal to the top surface 10a of the substrate 10. Over this tapered portion of the height, the lateral dimensions (length and width) of the section 33 increase with increasing distance from a plane containing the top surface 10a as the separation between opposite sidewalls 35 increases relative to the width, $w_2$. The section 33 also has a top portion 33b that adjoins the bottom portion 33a at an inflection point at which the tapering changes from outward to inward so that the separation between opposite sidewalls 35 decreases in a direction toward the section 31 of the collector pedestal 30 and the entrance to the trench 26.

The curved and tapered sidewalls 35 may function to reduce the collector-base capacitance (Ccb) in the device structure. The increase in the lateral dimensions of the section 33 of the collector pedestal 30 with increasing distance from a plane containing the top surface 10a of the substrate 10 and the convexity of the sidewalls 35 may also reduce the propagation of defects to the top surface of the section 31 of the collector pedestal 30.

The lateral dimensions (length and width) of the section 31 of the collector pedestal 30 may be greater than the lateral dimensions (length and width) of the section 33 of the collector pedestal 30 that is inside the trench 26. For example, the width, $w_3$, of the section 31 of the collector pedestal 30 may be greater than either the width, $w_2$, or the width, $w_1$. Similarly, the length of the section 31 of the collector pedestal 30 may be greater than a length of the section 31 of the collector pedestal 30.

The semiconductor material comprising the collector pedestal 30 may be formed by a selective epitaxial growth (SEG) deposition process. Epitaxy is a process by which the single-crystal semiconductor material of the collector pedestal 30 is deposited and grown on the single-crystal semiconductor material of the substrate 10 and in which the crystallographic structure of the single-crystal material of the substrate 10 is reproduced in the semiconductor material of the collector pedestal 30. During epitaxial growth, the semiconductor material constituting collector pedestal 30 will acquire the crystal orientation and crystal structure of single crystal semiconductor material of the substrate 10, which serves as a template for growth.

Because of the selective nature of SEG, the semiconductor material constituting the collector pedestal 30 does not nucleate for epitaxial growth from insulator surfaces, such as the top surface of the dielectric layer 20. However, the growth process is sustained such that the semiconductor material protrudes above the plane of the top surface of the dielectric layer 20 at the entrance to the trench 26, and then grows laterally across the top surface 20a of the dielectric layer 20. The location of the edge 32 may be controlled by controlling the epitaxial growth. The sections 31, 33 of the collector pedestal 30 may be achieved using a single selective epitaxy process, and are continuous and unitary portions of the collector pedestal 30 that share a crystal structure.

In an alternative embodiment, the collector pedestal 30 may be formed by non-selective epitaxial growth that deposits extraneous semiconductor material in the field that may be subsequently removed by the process flow.

Figure 5:
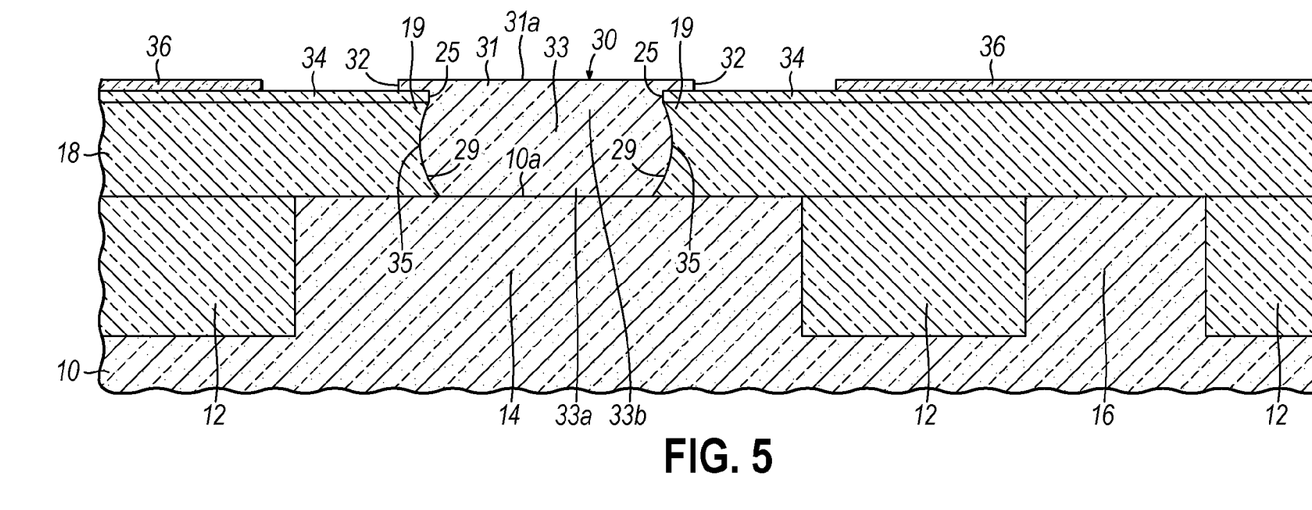

With reference to FIG. 5 in which like reference numerals refer to like features in FIG. 4 and at a subsequent fabrication stage of the processing method, the dielectric layer 20 is removed by an etching process. If the dielectric layer 20 is comprised of silicon nitride, then a wet chemical etch may be used with an etch chemistry that remove the dielectric layer 20 selective to (i.e., at a higher etch rate) the underlying dielectric layer 18. After the dielectric layer 20 is removed, a gap exists between the section 31 of the collector pedestal 30 and the top surface of the dielectric layer 18. A dielectric layer 34, which may have the same composition as the dielectric layer 18, is formed to occupy the gap. In one embodiment, the dielectric layer 34 may be comprised of $SiO_2$ deposited by CVD. A semiconductor layer 36 may be also formed on a top surface of the dielectric layer 34 in conjunction with the formation of the dielectric layer 34 as part of a CMOS process, and may be subsequently removed in the vicinity of the single crystal section 31 of the collector pedestal 30.

Figure 6:
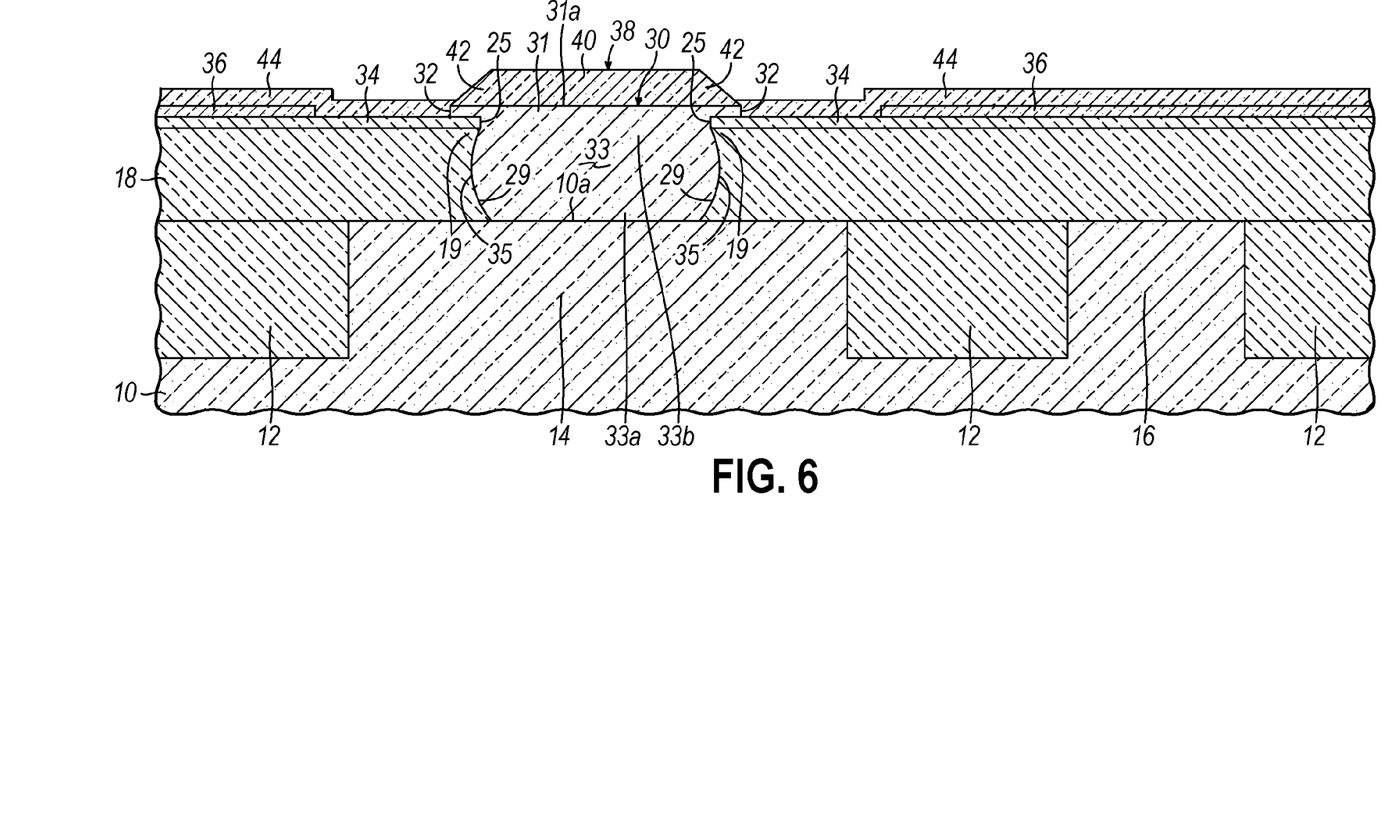

With reference to FIG. 6 in which like reference numerals refer to like features in FIG. 5 and at a subsequent fabrication stage of the processing method, an intrinsic base layer 38, which is comprised of a material suitable for forming an intrinsic base of a bipolar junction transistor, is formed as a continuous additive layer on the section 31 of the collector pedestal 30, which is single crystal. The intrinsic base layer 38 includes a single crystal section 40 positioned in vertical alignment with the section 31 of the collector pedestal 30 and that directly contacts the single crystal section 31 of the collector pedestal 30. The intrinsic base layer 38 further includes facets 42 that terminate at a location nominally coinciding with (i.e., coterminous with) the location of the edge 32 of section 31 and that surround the single crystal section 40. Due to this conterminous relationship, the collective width, $w_1$, of the single crystal section 40 and the facets 42 of the intrinsic base layer 38 is approximately equal to the width, $w_2$, of single crystal section 31 of the collector pedestal 30. The single crystal section 40 of intrinsic base layer 38 is physically coupled by the section 31 of the collector pedestal 30 with the section 33 of the collector pedestal 30 that is positioned in the trench 26.

The intrinsic base layer 38 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 38 may be uniform or the germanium content of intrinsic base layer 38 may be graded and/or stepped across the thickness of intrinsic base layer 38. If the germanium content is stepped, a thickness of the intrinsic base layer 38, such as a thickness directly contacting the single crystal section 31 of the collector pedestal 30, may not contain any germanium and may be entirely comprised of silicon (Si) to provide an i-layer between the single crystal section 31 of the collector pedestal 30 and the intrinsic base layer 38. The intrinsic base layer 38 may be doped with one or more impurity species, such as boron or phosphorus either with or without carbon.

Intrinsic base layer 38 may be formed using a low temperature epitaxial (LTE) growth process, such as vapor phase epitaxy (VPE) conducted at a growth temperature ranging from 400° C. to 850° C. Single crystal semiconductor material (e.g., single crystal silicon and/or single crystal SiGe) epitaxially grows in single crystal section 40, which is disposed on the single crystal section 31 of the collector pedestal 30. The crystal structure of single crystal semiconductor material of the single crystal section 31 of the collector pedestal 30 serves as a crystalline template for the growth of the crystal structure of the single crystal section 40 of intrinsic base layer 38 grown by the LTE growth process, which is considered to be a robust growth process. The facets 42 of intrinsic base layer 38 may comprise a mixture of polycrystalline and single crystal semiconductor material. A field region 44 of the intrinsic base layer 38 peripheral to the edges 32 of the section 31 of the collector pedestal 30.

The dimensions (length and width) of the single crystal section 40 and facets 42 of intrinsic base layer 38, collectively, in a plane parallel to the top surface 31*a* of the section 31 of the collector pedestal 30 are nominally equal to the dimensions (length and width) of the section 31 of the collector pedestal 30. The location of edge 32 determines the location of the facets 42. The lateral growth of the intrinsic base layer 38 outside of the trench 26 to edges 32 has the effect of laterally displacing the facets 42 to a position in space outside of the area of the active device region of the device structure, which may also reduce the collector-base capacitance (Ccb) in the device structure.

Figure 7:
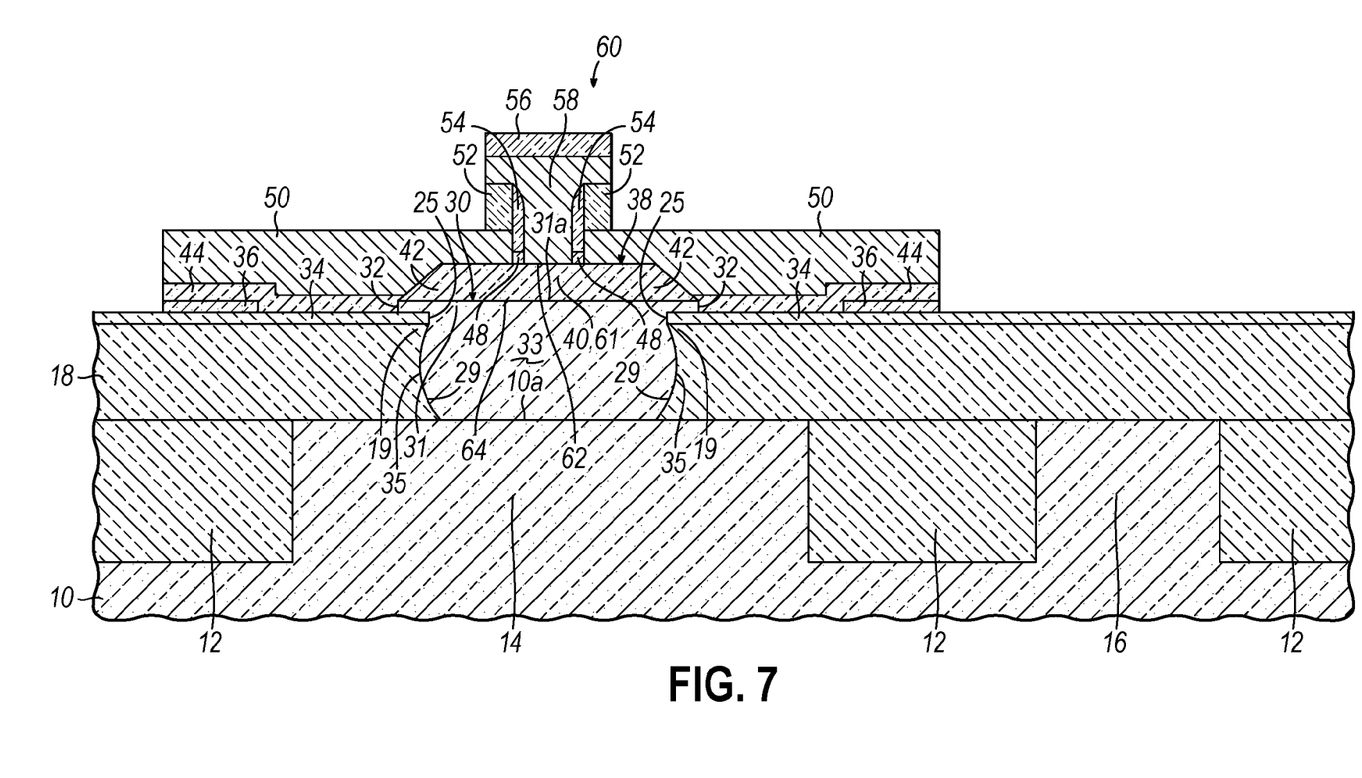

With reference to FIG. 7 in which like reference numerals refer to like features in FIG. 6 and at a subsequent fabrication stage of the processing method, a dielectric layer 48 is applied and patterned to leave a pad at the intended location of an emitter and an opening in the pad extending to the single crystal section 40 of intrinsic base layer 38. A raised extrinsic base layer 50 is formed that is coupled with the intrinsic base layer 38. In one embodiment, the extrinsic base layer 50 may be comprised of polycrystalline semiconductor material (e.g., polysilicon or polycrystalline SiGe deposited by CVD process. The extrinsic base layer 50 may be doped with a concentration of a dopant, such as an impurity species from Group III of the Periodic Table (e.g., boron) effective to impart p-type conductivity and may be optionally doped with carbon.

A dielectric layer 52 is formed on the extrinsic base layer 50. The dielectric layer 52 may be comprised of an electrical insulator, such as silicon nitride ($Si_3N_4$) or silicon dioxide ($SiO_2$) deposited using CVD. The dielectric layer 52 is patterned using photolithography and etching processes to define an emitter opening aligned with the collector pedestal 30. Non-conductive spacers 54 are formed inside the emitter opening and extend vertically to the base of the emitter opening. The spacers 54 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces.

The emitter opening is extended through the pad defined by dielectric layer 48 and an emitter 58 of a bipolar junction transistor 60 is formed in the emitter opening. The emitter 58 may be formed from a layer of semiconductor material that is deposited and then patterned using lithography and etching processes. The lithography process may utilize photoresist and photolithography to form an etch mask that protects only a strip of the semiconductor material registered with the emitter opening. A dielectric cap 56 formed from a dielectric layer formed on the semiconductor material layer may furnish the etch mask. An etching process that stops on the material of dielectric layer 52 is selected to fashion the emitter 58 from the protected strip of semiconductor material. The etch mask is subsequently removed.

The emitter 58 is electrically and physically coupled with the intrinsic base layer 38. The non-conductive spacers 54 encircle or surround the emitter 58 so that the emitter 58 is electrically isolated from the extrinsic base layer 50. The emitter 58 of the bipolar junction transistor 60 may be comprised of layer of a heavily-doped semiconductor material that is deposited and then patterned using lithography and etching processes. For example, the emitter 58 may be comprised of polysilicon or polycrystalline silicon-germanium deposited by CVD or LPCVD and heavily doped with a concentration of a dopant, such as an impurities species from Group V of the Periodic Table, such as phosphorus (P) or arsenic (As), to impart n-type conductivity.

The dielectric layer 52 and extrinsic base layer 50 may be lithographically patterned using one or more etch masks and etching processes, such as RIE, with suitable etch chemistries. The patterning of the extrinsic base layer 50 respectively defines an extrinsic base of the bipolar junction transistor 60. In addition, the collector contact region 16 is unburied by the patterning for the formation of a collector contact.

The intrinsic base 61 of the bipolar junction transistor 60 comprises the single crystal section 40 of the intrinsic base layer 38 that is disposed on the section 31 of the collector pedestal 30. The periphery of the intrinsic base layer 38 is coterminous with the edge 32 of the single crystal section 31 of the collector pedestal 30.

The bipolar junction transistor 60 has a vertical architecture in which the intrinsic base 61 is located between the emitter 58 and the collector pedestal 30, and the emitter 58, the intrinsic base 61 (i.e., the single crystal section 40 of the intrinsic base layer 38), and the collector pedestal 30/device region 14 are vertically arranged. The conductivity type of the semiconductor material constituting the emitter 58 and the collector pedestal 30 is opposite to conductivity type of the semiconductor material constituting the intrinsic base 61. An emitter-base junction 62 is defined at the interface between the emitter 58 and the intrinsic base 61. A base-collector junction 64 is defined at the interface between the collector pedestal 30 and the intrinsic base 61. The extrinsic base layer 50 defines an extrinsic base in the completed device structure that is used to contact the intrinsic base layer 38 and is located peripheral to the emitter 58. The bipolar junction transistor 60 may be characterized as a heterojunction bipolar transistor (HBT) if two or all three of the collector pedestal 30, the emitter 58, and the intrinsic base 61 are comprised of different semiconductor materials.

Figure 8:
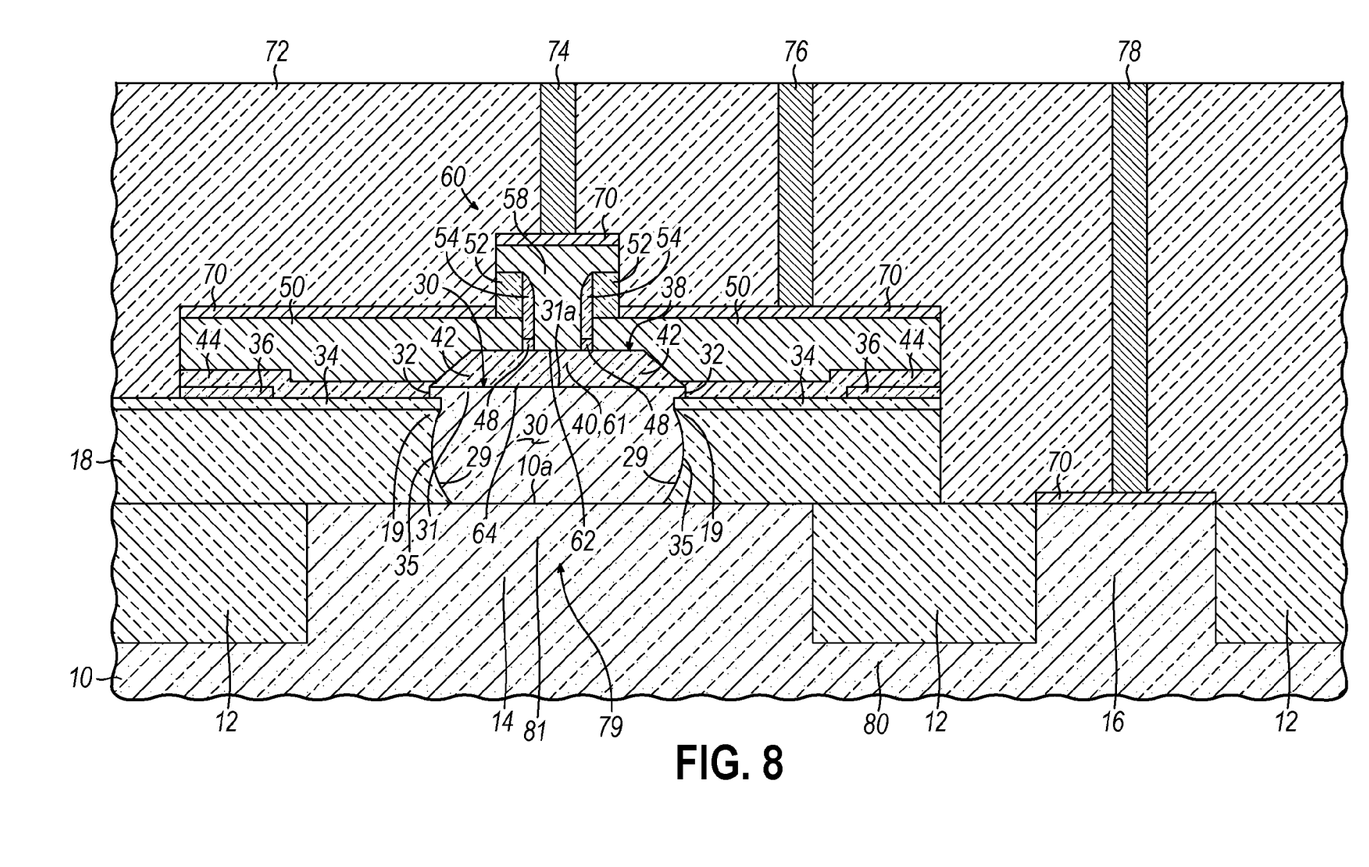

With reference to FIG. 8 in which like reference numerals refer to like features in FIG. 7 and at a subsequent fabrication stage of the processing method, standard silicidation and standard middle-end-of-line (MEOL) and back-end-of-line (BEOL) processing follows, which includes formation of contacts and wiring for the local interconnect structure overlying the bipolar junction transistor 60, and formation of dielectric layers, via plugs, and wiring for an interconnect structure coupled by the interconnect wiring with the bipolar junction transistor 60, as well as other similar contacts for additional device structures like bipolar junction transistor 60 and CMOS transistors included in other circuitry fabricated on the substrate 10. Other active and passive circuit elements, such as diodes, resistors, capacitors, varactors, and inductors, may be integrated into the interconnect structure and available for use in the BiCMOS integrated circuit.

Sections 70 of a silicide layer are formed on the collector contact region 16, the top surface of the extrinsic base layer 50 not covered by the emitter 58 and its spacers 54, the top surface of the emitter 58, and may be subsequently used in the process flow to contact the emitter 58. The silicide layer is absent from surfaces covered by the dielectric layer 48 and spacers 28. The sections 70 of the silicide layer may be formed by a silicidation process that involves one or more annealing steps to form a silicide phase by reacting a layer of silicide-forming metal and the semiconductor material contacting the silicide-forming metal. Candidate materials for the silicide-forming metal include, but are not limited to, refractory metals such as titanium (Ti), cobalt (Co), or nickel (Ni).

Middle-end-of-line (MEOL) processing, which includes formation of a dielectric layer 72, contacts 74, 76, 78, and wiring, follows to define a local interconnect structure for the bipolar junction transistor 60. Candidate inorganic dielectric materials for the dielectric layer 72 may include, but are not limited to, borophosphosilicate glass (BPSG), silicon dioxide ($SiO_2$), silicon nitride ($Si_3N_4$), fluorine-doped silicon glass (FSG), and combinations of these and other dielectric materials. Dielectric layer 72 may be deposited by any number of techniques, such as sputtering, spin-on application, or CVD. Contact 74 extends through the dielectric layer 72 to contact the section 70 of silicide layer on the emitter 58. Contact 76 extends through the dielectric layer 72 to contact the section 70 of silicide layer on the extrinsic base layer 50. Contact 78 extends through the dielectric layer 72 to contact the section 70 of silicide layer on the on the collector contact region 16.

A collector 79 is collectively defined by the collector pedestal 30 and either all or part of the device region 14. A sub-collector 80, which is comprised of a doped region of the semiconductor material of substrate 10, extends laterally from the collector pedestal 30 beneath the trench isolation region 12 to the collector contact region 16 operating as a reachthrough. The sub-collector 80 couples the collector pedestal 30 with the section 70 of the silicide layer on the collector contact region 16. The device region 14 may include a buried collector 81 and/or a portion of the sub-collector 80. The semiconductor materials of the sub-collector 80, the buried collector 81, and the collector pedestal 30 have the same conductivity type (e.g., n-type conductivity).

During the front-end-of-line (FEOL) portion of the fabrication process, the device structure of the bipolar junction transistor 60 is replicated across at least a portion of the surface area of the substrate 10. In BiCMOS integrated circuits, complementary metal-oxide-semiconductor (CMOS) transistors may be formed using other regions of the substrate 10. As a result, both bipolar and CMOS transistors may be available on the same substrate 10. Standard back-end-of-line (BEOL) processing follows, which includes formation of dielectric layers, via plugs, and wiring for an interconnect structure coupled by the local interconnect structure with the bipolar junction transistor 60, as well as other similar contacts for additional device structures like bipolar junction transistor 60 and CMOS transistors included in other circuitry fabricated on the substrate 10.

Figure 9:
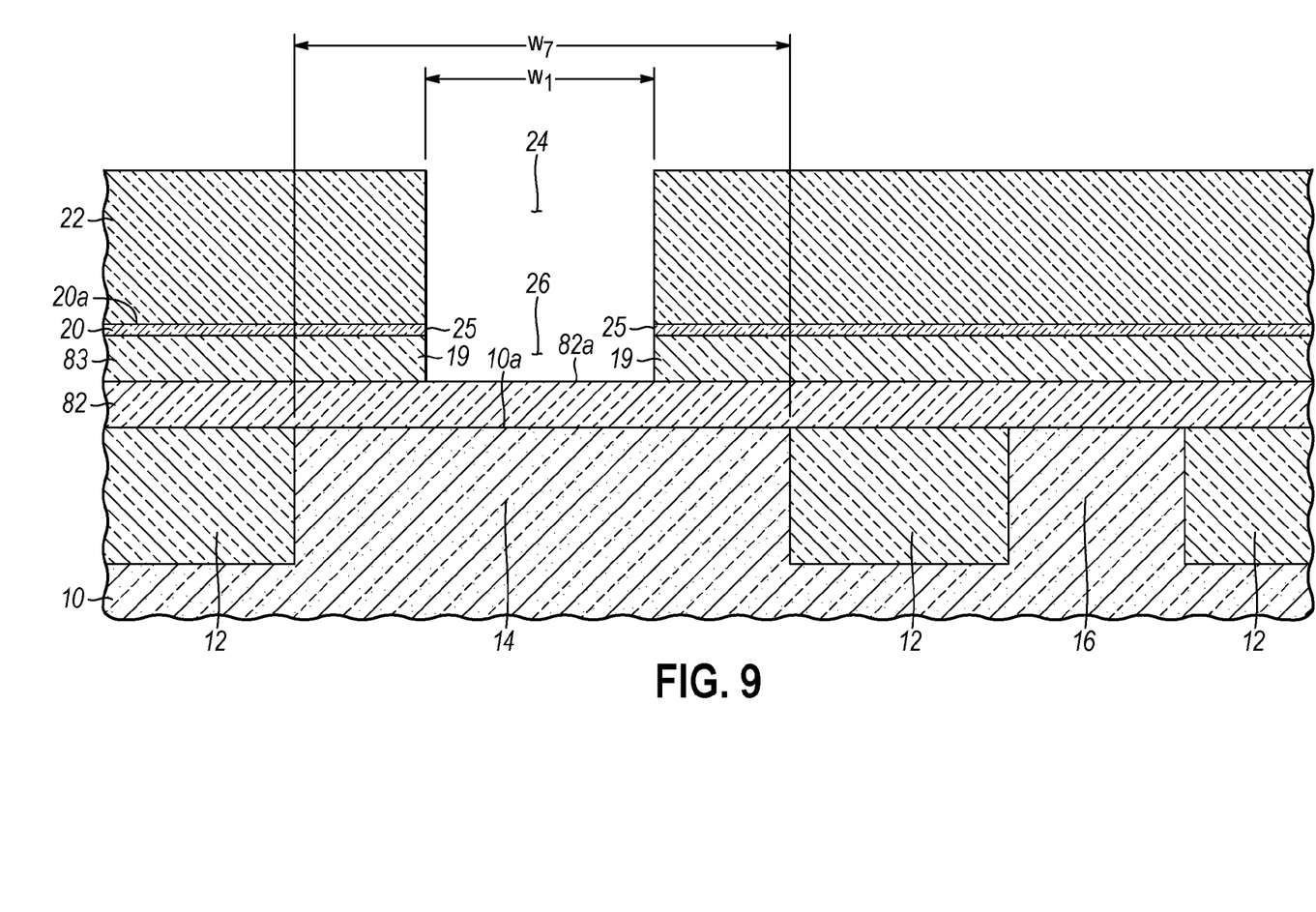
FIGS. 9-11 are cross-sectional views of a portion of a substrate at successive fabrication stages of a processing method for fabricating a device structure in accordance with an alternative embodiment of the invention.

With reference to FIG. 9 in which like reference numerals refer to like features in FIG. 1 and in accordance with an alternative embodiment, a plurality of dielectric layers 82, 83 may be formed between dielectric layer 20 and the top surface 10a of the substrate 10. The dielectric layer 82, which is located between the dielectric layer 83 and the substrate 10, may have an etch rate that is greater than the etch rate for dielectric layer 82 for a given etch chemistry. In one embodiment, the dielectric layers 82, 83 may be comprised of materials of the same composition that, when formed, have different physical properties to provide the different etch rates. In one embodiment, the dielectric layers 82, 83 may be formed by different processes to provide the different physical properties. For example, dielectric layer 83 may be comprised of silicon dioxide formed by a deposition process, such as CVD, and dielectric layer 82 may be comprised of silicon dioxide formed by a thermal oxidation process.

When the trench 26 is etched, the etching process may penetrate completely through the dielectric layer 83. In one embodiment, the etching process may stop, or may be stopped if timed or end-pointed, at the top surface 82a of the dielectric layer 82 so that the trench 26 does not penetrate into the dielectric layer 82. In another embodiment, the trench 26 may penetrate into the dielectric layer 82 but not completely through the dielectric layer 82.

Figure 10:
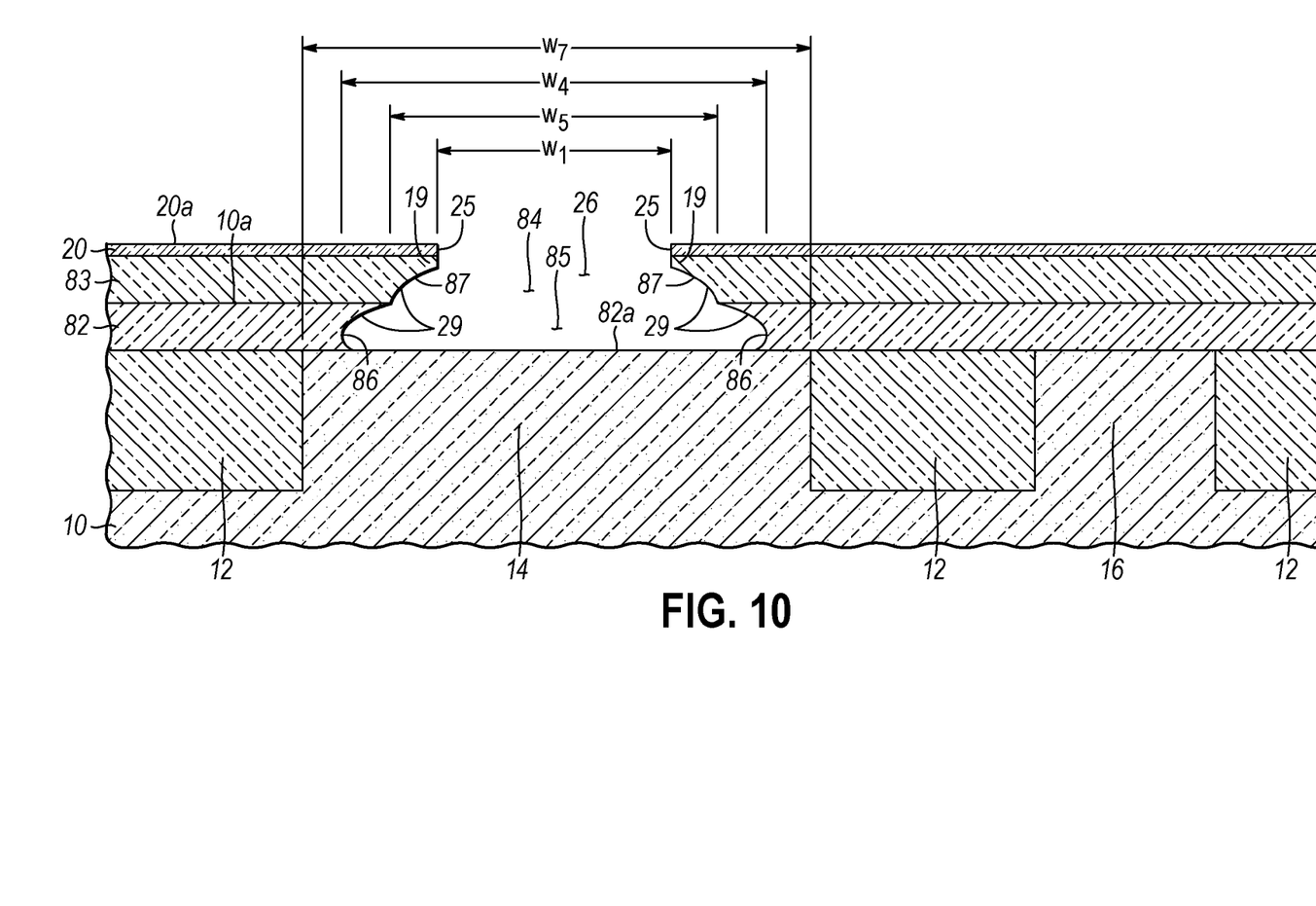

With reference to FIG. 10 in which like reference numerals refer to like features in FIG. 9 and at a subsequent fabrication stage of the processing method, the process flow continues as described with respect to FIGS. 2 and 3. An etching process may be selected that has an etch chemistry that etches the dielectric layer 82 at an etch rate greater than an etch rate for the dielectric layer 83. In addition, a portion of the dielectric layer 83, which is similar to the portion 19 of dielectric layer 18, is protected by the spacer 28 (FIGS. 2, 3) during the etching process. The result is that the trench 26 develops a double inverted bowl shape with sections 84, 85 characterized by distinctly different lateral dimensions (e.g., widths). Section 85 is closer to the top surface 10a of the substrate 10 than section 84.

The sidewalls 29 bordering the trench 26 are divided into sidewalls 86 of the dielectric layer 82 that border section 85 and sidewalls 87 of the dielectric layer 83 that border section 84. Opposite pairs of the sidewalls 86 are separated by a width, $w_4$, at the top surface 10a. Opposite pairs of the sidewalls 87 are separated by a width, $w_5$, at the top surface 82a that is less than the width, $w_4$. Each of these widths is greater than the width, $w_1$. As a result, the width of the trench 26 decreases on average with increasing distance from a plane containing the top surface 10a because of the smaller width separating sidewalls 87 than sidewalls 86. The width of the trench 26 between an opposite pair of the sidewalls 86 and the width of the trench 26 between an opposite pair of the sidewalls 87 varies with increasing distance from a plane containing the top surface 10a of the substrate 10 (i.e., the top surface of the device region 14). In addition, the width of the sidewalls 29 varies because sidewalls 86 have a different width than sidewalls 87 and, more specifically, the width between an opposite pair of the sidewalls 29 decreases with increasing distance from a plane containing the top surface 10a of the substrate 10.

Figure 11:
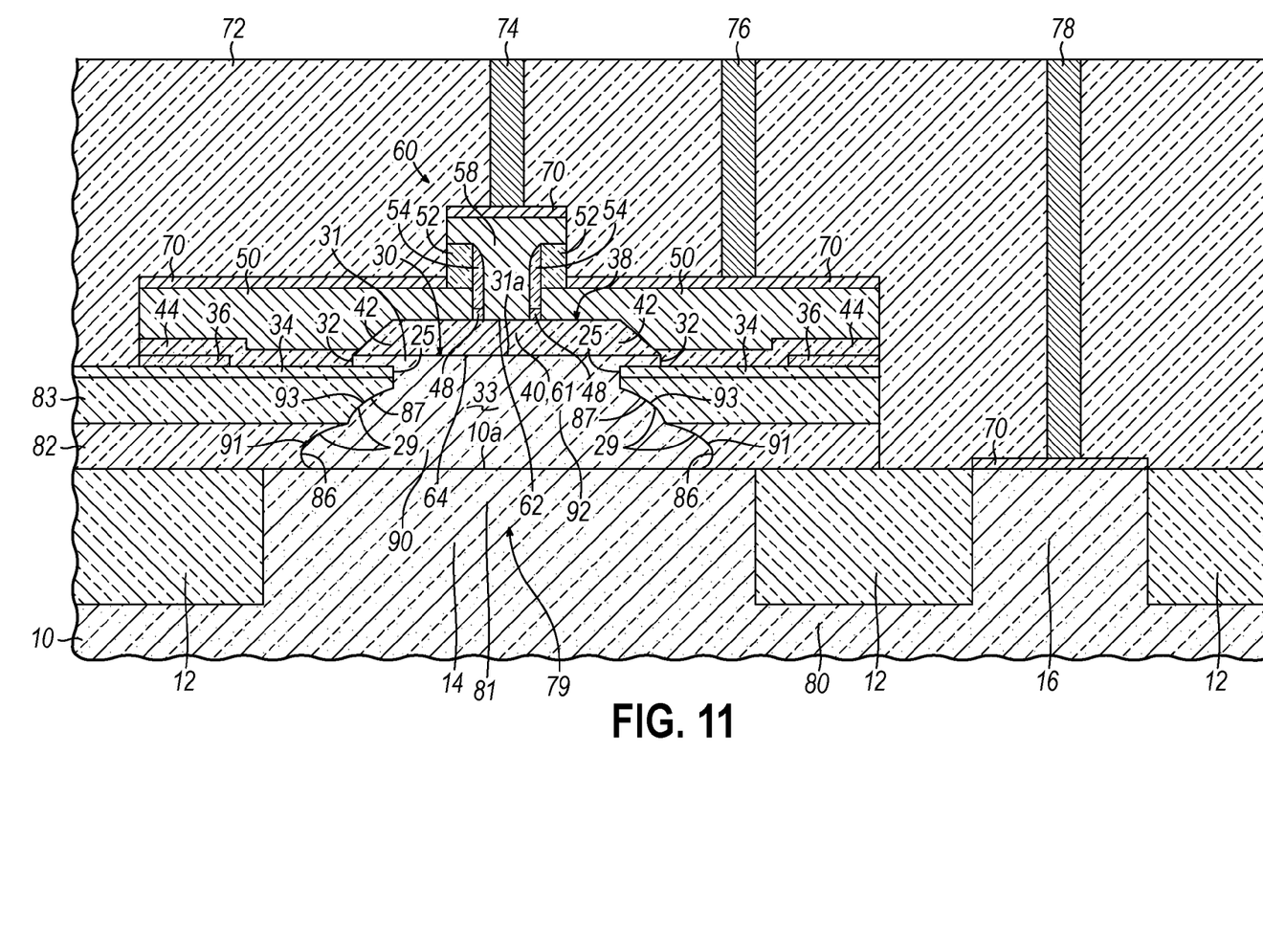

With reference to FIG. 11 in which like reference numerals refer to like features in FIG. 10 and at a subsequent fabrication stage of the processing method, the process flow continues as described with respect to FIGS. 4-8 to complete the bipolar junction transistor 60.

The collector pedestal 30 in the device structure of the bipolar junction transistor 60 adopts a double inverted bowl shape that conforms to the double inverted bowl shape of the trench 26 provided by the different adjoining sections 84, 85 and the different widths of these sections 84, 85. The collector pedestal 30 includes a bottom section 90 with convex tapered sidewalls 91 that match the concave curvature of the sidewalls 86 of the dielectric layer 82 bordering the section 85 of the trench 26. Opposite pairs of the sidewalls 91 of the bottom section 90 are separated at the top surface 10a by the width, $w_4$. The collector pedestal 30 may be considered to include a top section 92 with convex tapered sidewalls 93 that match the concave curvature of the sidewalls 87 of the dielectric layer 83 bordering the section 84 of the trench 26. Opposite pairs of the sidewalls 91 of the bottom section 90 are separated by the width, $w_4$, (FIG. 10) that is greater than the width, $w_5$, (FIG. 10) between the opposite sidewalls 93 of the top section 92. The width between an opposite pair of the sidewalls 91 varies with increasing distance from the top surface 10a of the substrate 10, as does the width between an opposite pair of the sidewalls 93.

The portion of the collector pedestal 30 inside of the trench 26 has a double inverted bowl shape in which the bottom section 90 is wider than the top section 92 so that the width effectively decreases with increasing distance from a plane containing the top surface 10a of substrate 10. That is, the average width of the bottom section 90 is greater than an average with of the top section 92.

The curved tapered sidewalls 91, 93 and their decreasing width with increasing distance from the top surface 10a in the double-inverted bowl-shaped profile may reduce the collector-base capacitance (Ccb), while maintaining low collector resistance (Rc). These characteristics may also reduce defect propagation to the top surface of the section 31 of the collector pedestal 30 on which the intrinsic base layer 38 is grown.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar junction transistor, the method comprising:
    forming a first layer on a top surface of a substrate;
    forming a second layer on the first layer;
    forming a trench in the first layer and the second layer that has a plurality of first sidewalls with a first concave curvature, a plurality of second sidewalls with a second concave curvature, a first width between an opposite pair of the first sidewalls that varies with increasing distance from the top surface of the substrate, and a second width between an opposite pair of the second sidewalls that varies with increasing distance from the top surface of the substrate; and
    forming a collector pedestal of the bipolar junction transistor in the trench.

2. The method of claim 1 wherein the trench is aligned with an opening in a third layer formed on the second layer, the collector pedestal includes a first section in the trench, and further comprising:
    forming a second section of the collector pedestal that projects above the third layer and that laterally terminates at an edge that overlaps with a top surface of the third layer.

3. The method of claim 2 wherein forming the collector pedestal of the bipolar junction transistor in the trench further comprises:
    epitaxially growing a semiconductor material from the top surface of the substrate to form the first section of the collector pedestal in the trench,
    wherein, after the first section of the collector pedestal is epitaxially grown, the second section of the collector pedestal is formed by lateral overgrowth of the semiconductor material from the opening in the third layer across the top surface of the third layer.

4. The method of claim 3 further comprising:
    forming an intrinsic base layer on the second section of the collector pedestal,
    wherein the intrinsic base layer includes a single crystal section that is coextensive with the first section of the collector pedestal and a facet proximate to the edge of the second section of the collector pedestal.

5. The method of claim 1 wherein the collector pedestal includes a first section bounded by a plurality of first sidewalls that include a convex curvature that matches the first concave curvature.

6. The method of claim 1 wherein the second width is less than the first width.

7. The method of claim 1 further comprising:
    forming a third layer on the second layer; and
    patterning the third layer to define an opening,
    wherein the trench is aligned with the opening in the third layer when formed.

8. The method of claim 7 wherein forming the trench in the first layer and the second layer comprises:
    etching the trench through a first thickness of the first layer; and
    after the trench is etched through the first thickness of the first layer, forming spacers on the first sidewalls of the trench; and
    after the spacers are formed on the first sidewalls of the trench, etching the trench completely through a second thickness of the second layer.

9. The method of claim 8 further comprising:
    after the trench is etched through the second thickness of the second layer, removing the spacers; and after the collector pedestal is formed, removing the third layer.

10. The method of claim 7 wherein the first layer and the second layer are comprised of silicon dioxide, and the third layer is comprised of silicon nitride.

11. The method of claim 10 wherein forming the first layer on the top surface of the substrate comprises:
thermally oxidizing the substrate to form the silicon dioxide comprising the first layer.

12. The method of claim 10 wherein forming the second layer on the first layer comprises:
depositing the silicon dioxide comprising the second dielectric material to form the second layer.

13. The method of claim 1 wherein the first layer is comprised of a first dielectric material that etches at a first etch rate, the second layer is comprised of a second dielectric material that etches at a second etch rate, and the first etch rate differs from the second etch rate.

14. The method of claim 13 wherein the first etch rate is greater than the second etch rate.

15. The method of claim 1 wherein forming the first layer on the top surface of the substrate comprises:
thermally oxidizing the substrate to form the first layer.

16. The method of claim 15 wherein forming the second layer on the first layer comprises:
depositing silicon dioxide comprising the second dielectric material to form the second layer.

17. The method of claim 1 wherein forming the second layer on the first layer comprises:
depositing silicon dioxide comprising the second dielectric material to form the second layer.

18. The method of claim 1 wherein forming the trench in the first layer and the second layer comprises:
etching the trench through a first thickness of the first layer; and
after the trench is etched through the first thickness of the first layer, forming spacers on the first sidewalls of the trench; and
after the spacers are formed on the first sidewalls of the trench, etching the trench completely through a second thickness of the second layer.

19. The method of claim 18 further comprising:
after the trench is etched through the second thickness of the second layer, removing the spacers.

20. The method of claim 5 wherein the collector pedestal includes a second section bounded by a plurality of second sidewalls that include a convex curvature that matches the second concave curvature.

* * * * *